United States Patent
Lin

(10) Patent No.: US 8,648,458 B2
(45) Date of Patent: Feb. 11, 2014

(54) LEADFRAME CIRCUIT AND METHOD THEREFOR

(75) Inventor: Barry Lin, Kaohsiung (TW)

(73) Assignee: NXP B.V., Eindhoven (NL)

( * ) Notice: Subject to any disclaimer, the term of this patent is extended or adjusted under 35 U.S.C. 154(b) by 284 days.

(21) Appl. No.: 12/837,740

(22) Filed: Jul. 16, 2010

(65) Prior Publication Data

US 2011/0147903 A1  Jun. 23, 2011

Related U.S. Application Data

(60) Provisional application No. 61/287,902, filed on Dec. 18, 2009.

(51) Int. Cl.
  *H01L 23/492*  (2006.01)
(52) U.S. Cl.
  USPC ............ 257/695; 257/E23.033; 257/E23.038; 257/E23.049; 257/E23.056
(58) Field of Classification Search
  USPC .......... 438/107, 111, 118, 125; 257/E21.505, 257/E23.033, E23.038, E23.049, E23.056, 257/695
  See application file for complete search history.

(56) References Cited

U.S. PATENT DOCUMENTS

| | | | | |
|---|---|---|---|---|
| 4,951,122 A | * | 8/1990 | Tsubosaki et al. | 257/792 |
| 5,175,060 A | * | 12/1992 | Enomoto et al. | 428/620 |
| 5,234,866 A | * | 8/1993 | Okinaga et al. | 29/827 |
| 5,471,097 A | * | 11/1995 | Shibata | 257/787 |
| 5,646,829 A | * | 7/1997 | Sota | 361/813 |
| 5,710,457 A | * | 1/1998 | Uno | 257/666 |
| 5,837,567 A | * | 11/1998 | Tanaka et al. | 438/123 |
| 5,929,514 A | * | 7/1999 | Yalamanchili | 257/676 |
| 6,130,115 A | * | 10/2000 | Okumura et al. | 438/124 |
| 8,358,017 B2 | | 1/2013 | Tsui | |
| 2004/0089923 A1 | * | 5/2004 | Miyaki et al. | 257/668 |
| 2005/0236698 A1 | * | 10/2005 | Ozawa et al. | 257/666 |

FOREIGN PATENT DOCUMENTS

| | | | | |
|---|---|---|---|---|
| CN | 101582403 A | | 11/2009 | |
| JP | 2003174063 A | * | 6/2003 | |

* cited by examiner

*Primary Examiner* — George Fourson, III

(57) ABSTRACT

An integrated circuit leadframe device supports various chip arrangements. As consistent with various embodiments, a leadframe includes a plurality of banks of conductive integrated circuit chip connectors. Each bank has a plurality of conductive strips respectively having an end portion, the end portions of each of the strips in the bank being substantially parallel to one another and arranged at an oblique angle to end portions of strips in at least one of the other banks. Each of the end portions has a tip extending to an interior portion of the leadframe device and separated from the other tips by a gap. A fastening material is arranged on at least some of the conductive strips and configured to fasten an integrated circuit chip to the conductive strips

21 Claims, 4 Drawing Sheets

LEADFRAME CIRCUIT AND METHOD THEREFOR

This patent document claims benefit under 35 U.S.C. §119 to U.S. Provisional Patent Application Ser. No. 61/287,902, entitled "LEADFRAME CIRCUIT AND METHOD THEREFOR" and filed on Dec. 18, 2009, which is fully incorporated herein by reference.

The present invention relates generally to circuits, and more specifically to leadframes and leadframe circuits.

Leadframes are used to support and connect to integrated circuits and other semiconductor chips. Often, the chips are secured to the leadframe and contacts on the chips are wire bonded to leads, or connectors, in the leadframe to bring the contacts (electrically) to leadframe contacts at an outer portion of the leadframe. These leadframe contacts thus permit electrical connection of the chips to other devices.

Unfortunately, many leadframes are limited in their application to a particular design. When leadframes of different designs are required, equipment used to manufacture the leadframes has to be modified or new/different equipment is required. These changes can be costly, time consuming and generally detrimental to the design, implementation and use of semiconductor and integrated circuit devices.

These and other issues continue to present challenges to the design, manufacture and utilization of leadframes and electronic devices employing the same.

The present invention is exemplified in a number of implementations and applications, some of which are summarized below.

Consistent with an example embodiment of the present invention, an integrated circuit leadframe device includes a plurality of banks of conductive integrated circuit chip connectors, and a fastening material configured to fasten integrated circuit chips to the connectors. Each bank includes a plurality of conductive strips respectively having an end portion, where the end portions in each of the strips are parallel with end portions of other strips within the bank. From bank to bank, respective end portions are at oblique angles to one another. This arrangement can permit electrical access to an interior portion of the leadframe from an outer connection. Each of the end portions has a tip extending to an interior portion of the leadframe device and separated from the other tips by a gap. A fastening material is on at least some of the conductive strips and configured to fasten an integrated circuit chip to the conductive strips.

Another example embodiment is directed to an integrated circuit device comprising a leadframe, a fastener and an integrated circuit chip fastened to the leadframe by the fastener. The leadframe includes a plurality of banks of conductive integrated circuit chip connectors. Each bank includes a plurality of conductive strips respectively having an end portion. The end portions of each of the strips in the bank are substantially parallel to one another and arranged at an oblique angle to end portions of strips in at least one of the other banks. Each of the end portions has a tip extending to an interior portion of the leadframe device and separated from the other tips by a gap. Each strip has a contact region near an outer portion of the plurality of banks and is configured for electrically connecting to an integrated circuit chip located near an interior region of the leadframe, via the strip. At least one adhesive fastener is coupled to at least some of the conductive strips, and an integrated circuit chip having a plurality of electric connection regions is fastened to the leadframe by the fastener. Each of a plurality of wire connectors respectively connects one of the electric connection regions to a single one of the conductive strips.

Other example embodiments are directed to methods of connecting integrated circuits and methods of manufacturing a leadframe as described herein, with one, two or more integrated circuit chips coupled to a common leadframe design in accordance with various configurations.

The above summary is not intended to describe each embodiment or every implementation of the present disclosure. The figures and detailed description that follow more particularly exemplify various embodiments.

The invention may be more completely understood in consideration of the following detailed description of various embodiments of the invention in connection with the accompanying drawings, in which.

Figure 1:
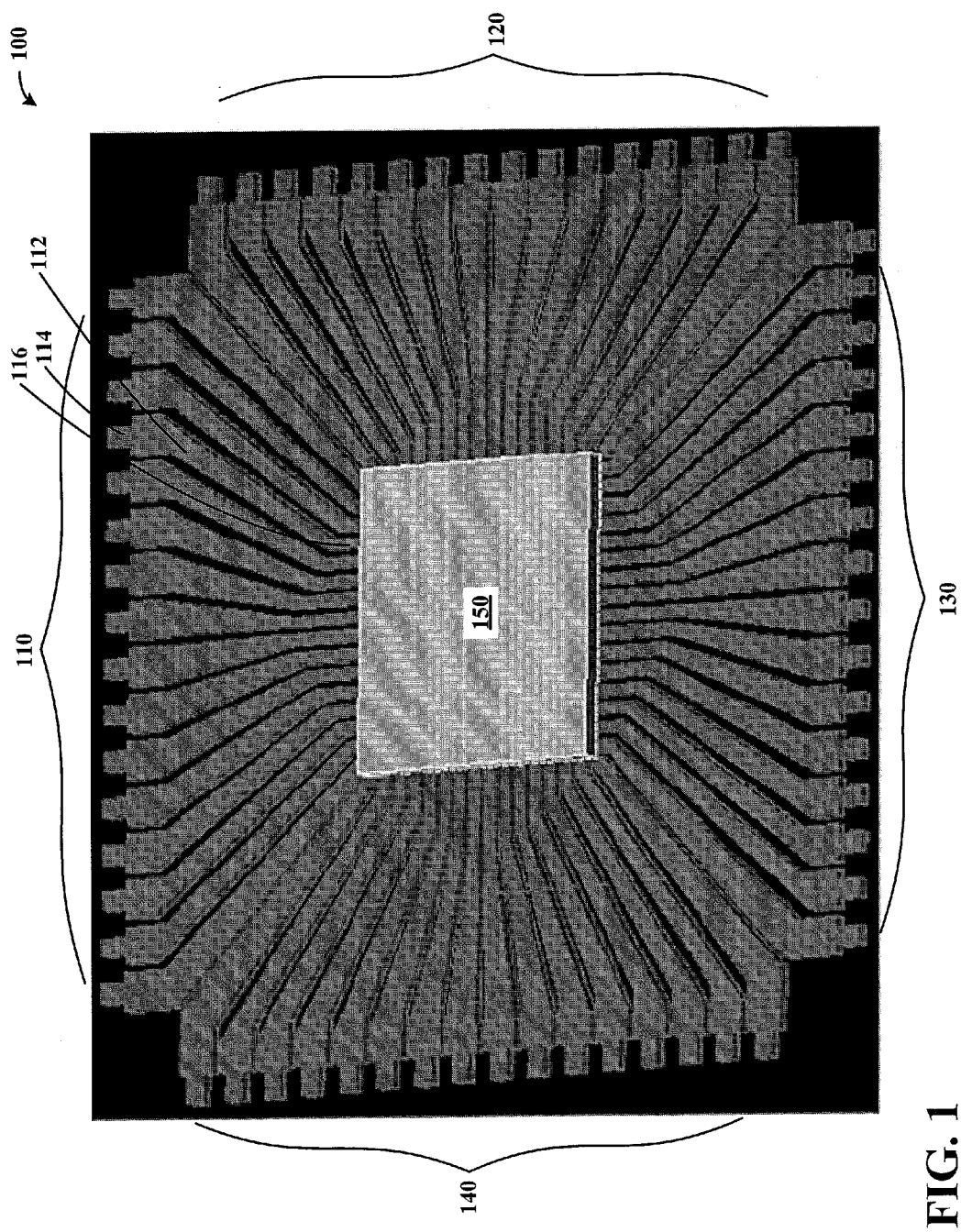
FIG. 1 shows a leadframe circuit with adhesive material for connecting an integrated circuit chip, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

The present invention is believed to be applicable to a variety of different types of processes, devices and arrangements involving leadframes and electronic devices employing leadframes. While the present invention is not necessarily so limited, various aspects of the invention may be appreciated through a discussion of examples using this context.

In connection with an example embodiment, a leadframe for an integrated circuit device includes a plurality of banks of conductive integrated circuit chip connectors, with each bank having a plurality of conductive strips respectively having an end portion. The end portions each of the strips within a particular bank are generally parallel to one another, and are further arranged at an oblique angle to end portions of strips in at least one of the other banks. Each of the end portions includes a tip extending to an interior portion of the leadframe device and separated from the other tips by a gap. Effectively, the tips of every strip in each bank are separated from the tips of strips in other banks by the gap, which electrically isolates the strips. A fastening material is located on at least some of the conductive strips and configured to fasten an integrated circuit chip to the conductive strips.

The respective banks are configured to connect to one or more integrated circuit devices, depending upon the application. In some implementations, each bank of conductive strip connectors is configured to attach to and electrically couple circuits (e.g., separate nodes and/or as connected to individual circuits) within an integrated circuit.

In other implementations, different banks are electrically coupled to different integrated circuits. In such implementations, the fastening material may be implemented with two separate fasteners respectively coupled to different banks, and configured to fasten different integrated circuit chips to the conductive strips in each bank. To facilitate electrical isolation as appropriate, each bank of conductive integrated circuit chip connectors is electrically isolated from other banks by the separation between the tips of the end portions of the respective conductive strips, and by lateral separation between strips running alongside one another as applicable.

Another embodiment is directed to an integrated circuit device, having a leadframe as discussed above and one or more integrated circuit chips fastened to the conductive strips by the fastening material. The chips are fastened to one, two or more of the banks of connectors, depending upon the application. In some implementations, the integrated circuit chip and fastening material are similar in size and shape (e.g., a planar chip adhered to a planar fastener of similar shape, such as rectangular, circular or oval). In other implementations, the fastening material is smaller in size than the chip. Using these approaches, adhesive or other fastening material can be reduced as may be relative, for example, to applying adhesive to an entire chip.

Turning now to the figures, FIG. 1 shows a leadframe circuit 100 with adhesive material for connecting an integrated circuit chip, according to an example embodiment of the present invention. The leadframe circuit 100 includes four banks 110, 120, 130 and 140, each bank having a plurality of conductive strips. Various embodiments involve fewer or more banks, and/or fewer or more conductive strips per bank, depending upon the implementation.

Referring to strip 112 by way of example, each strip has an elongated conductive strip portion extending to an outer contact 114, and a tip region 116 that extends along tip portions of strips in other banks. Over the tip regions of the respective strips, a fastening material 150 is secured to the strips and configured for coupling to an integrated circuit device, to fasten the integrated circuit device for coupling to the leadframe.

Figure 2:
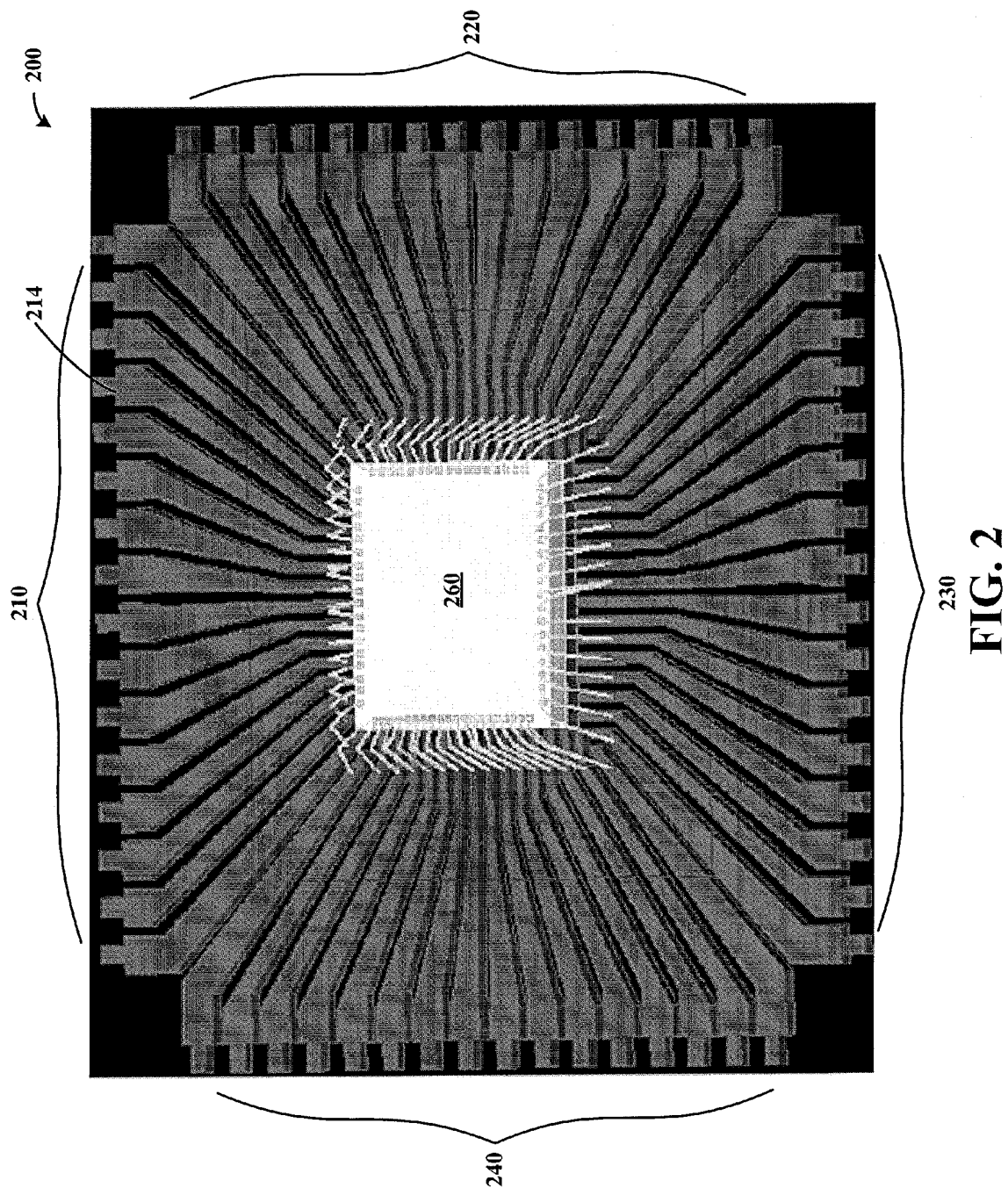
FIG. 2 shows circuit having a leadframe with an integrated circuit chip coupled thereto, according to another example embodiment of the present invention.

FIG. 2 shows a circuit 200 having a leadframe, similar to that shown in FIG. 1, and an integrated circuit chip 260 fastened to the leadframe, according to another example embodiment of the present invention. As described herein, the placement of the fastening material and integrated circuit chip can be varied to suit different implementations.

In this instance, the integrated circuit chip 260 is fastened to a central portion of the leadframe circuit 200, and electrically coupled (wire bonded) to individual conductive strips in each of banks 210, 220, 230 and 240 of the leadframe. Specifically, each contact on an upper surface of the chip 260 is wire bonded to a single conductive strip.

Figure 3:
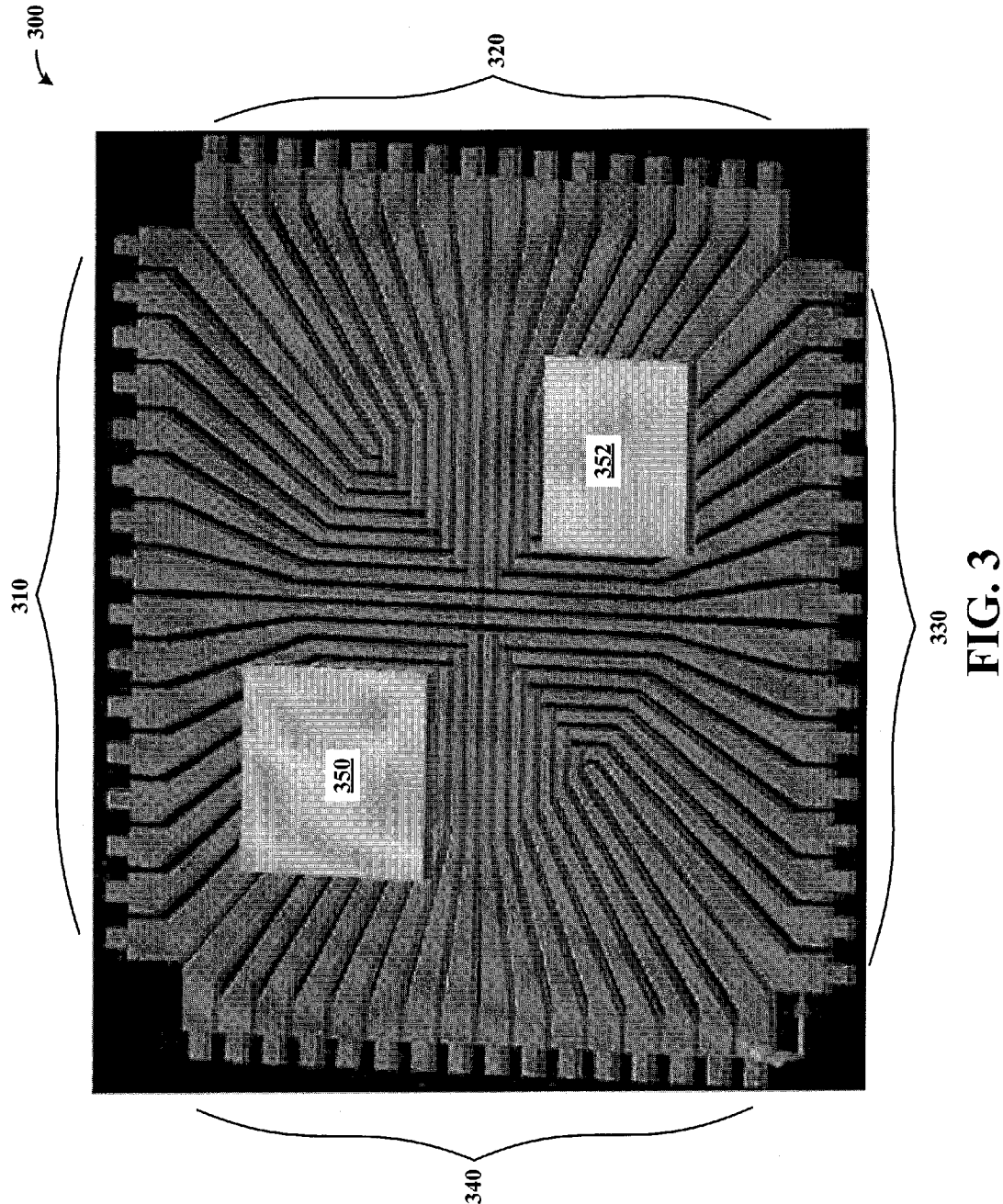
FIG. 3 shows a leadframe circuit with adhesive material for connecting two integrated circuit chips, according to an example embodiment of the present invention.

FIG. 3 shows a leadframe circuit 300 with adhesive material for connecting two integrated circuit chips, according to another example embodiment of the present invention. The leadframe circuit 300 is similar to the circuit shown in FIG. 1, having banks 310, 320, 330 and 340 and separate fasteners 350 and 352.

As shown, each of the conductive strips for the respective banks has a tip that extends substantially parallel to other end portions within the bank in which the strip resides, and that lies at an oblique angle to tips in adjacent banks. The ends of the tips are separated by a gap and/or insulating material, electrically isolating the tips from one another. Fastener 350 is located on banks 310 and 340, and fastener 352 is located on banks 330 and 350.

Figure 4:
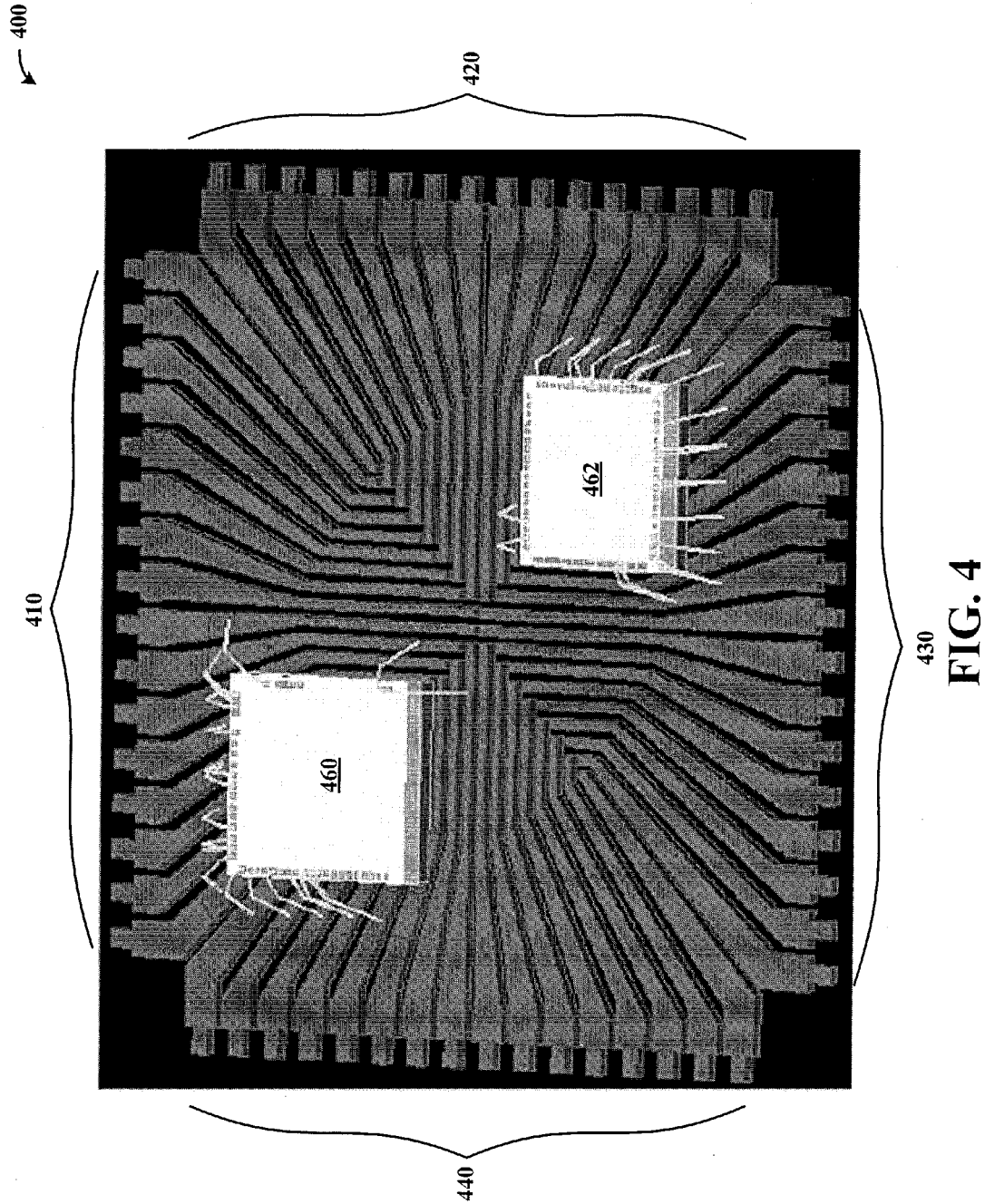
FIG. 4 shows a circuit having a leadframe with two integrated circuit chips coupled thereto, according to another example embodiment of the present invention.

FIG. 4 shows a circuit 400 having a leadframe, similar to that shown in FIG. 3, and two integrated circuit chips 460 and 462 fastened to the leadframe by fasteners, according to another example embodiment of the present invention. Chip 460 is electrically coupled to banks 410 and 440, and chip 462 is electrically coupled to banks 430 and 450.

In connection with one or more embodiments, leadframes as described herein are manufactured using a common stamping tool for different leadframe designs, in a common package size. For example, the leadframe circuits shown in FIG. 1 and in FIG. 3, for coupling to different arrangements of integrated circuit dies, can be manufactured with a common stamping machine. In addition, by locating chips relative to different banks, wire lengths can be reduced (e.g., from the outer contact 214 to chip 260 in FIG. 2). In addition, flying effects at wire bonds can be mitigated.

Based upon the above discussion and illustrations, those skilled in the art will readily recognize that various modifications and changes may be made to the present invention without strictly following the exemplary embodiments and applications illustrated and described herein. Such modifications and changes may include, for example, integrating different aspects of the leadframes described, using different numbers of integrated circuit chips or other types of chips, different types of fasteners or combinations of the same. These and other modifications do not depart from the true spirit and scope of the present invention, including that set forth in the following claims.

What is claimed is:

1. An integrated circuit leadframe device comprising:
   a plurality of banks of conductive integrated circuit chip connectors, each bank having a plurality of conductive strips respectively having inner and outer end portions, the inner end portions of said plurality of conductive strips within each bank extending along a length having a direction being at a substantially parallel angle to one another, and the outer end portions of the plurality of conductive strips within each bank extending along a length having a direction that fans out at an oblique angle, relative to the substantially parallel angle, the respective lengths corresponding to a largest dimension of the end portions, and the respective inner and outer end portions of each conductive strip forming substantially the entire conductive strip;
   each of the end portions having a tip extending to an interior portion of the leadframe device and separated from the other tips by a gap; and
   a fastening material on at least some of the conductive strips and configured to fasten an integrated circuit chip to the conductive strips.

2. The device of claim 1, wherein each bank of conductive strip connectors is configured to attach to and electrically couple circuits within an integrated circuit.

3. The device of claim 1, further including an integrated circuit chip fastened to the conductive strips by the fastening material.

4. The device of claim 1,
   further including an integrated circuit chip having a planar shape and fastened to the conductive strips by the fastening material,
   wherein the fastening material is a planar material having a lower surface that extends along a plane defined by a surface of the conductive strips, and an upper surface coupled to a lower surface of the integrated circuit chip, and
   wherein the surfaces of the integrated circuit chip and the fastening material are about the same size and shape.

5. The device of claim 1,
   further including an integrated circuit chip having a planar shape and fastened to the conductive strips by the fastening material,
   wherein the fastening material is a planar material having a lower surface that extends along a plane defined by a surface of the conductive strips, and an upper surface coupled to a lower surface of the integrated circuit chip, and wherein the surfaces of the fastening material respectively have a surface area that is less than the surface area of the lower surface of the integrated circuit chip.

6. The device of claim 1, wherein the fastening material includes two separate fasteners respectively configured to fasten different integrated circuit chips to the conductive strips, and further including, on each fastener, an integrated circuit chip having a planar shape and fastened to the conductive strips by the fastener.

7. An integrated circuit leadframe device comprising:

a plurality of banks of conductive integrated circuit chip connectors;

in each bank, a plurality of conductive strips respectively having an end portion, the end portions of said plurality of conductive strips being at a substantially parallel angle to one another and, along outer portions thereof, arranged to fan out at an oblique angle, relative to the substantially parallel angle;

each of the end portions having a tip extending to an interior portion of the leadframe device and separated from the other tips by a gap; and a fastening material on at least some of the conductive strips and configured to fasten an integrated circuit chip to the conductive strips, wherein each bank of conductive integrated circuit chip connectors is electrically isolated from other banks by the separation between the tips of the end portions of the respective conductive strips, and the fastening material includes a separate fastener on each bank, each fastener being coupled to an integrated circuit chip.

8. The device of claim 1, wherein at least two of the banks of conductive integrated circuit chip connectors are coupled to a common integrated circuit chip fastened to the banks via the fastening material.

9. An integrated circuit device comprising:

a leadframe including
 a plurality of banks of conductive integrated circuit chip connectors,
 in each bank, a plurality of conductive strips respectively having
  an inner end portion being at a substantially parallel angle to the inner end portions of said plurality of conductive strips within the bank, and an outer end portion arranged to fan out at an oblique angle, relative to the substantially parallel angle, each of the inner end portions having a tip extending to an interior portion of the leadframe device and separated from the other tips by a gap, the inner end portion of each conductive strip extending along a length in a direction that is at an oblique angle relative to a direction along which a length of the outer portion of the conductive strip extends, the respective lengths being a largest dimension of the respective end portions, the respective end portions of each conductive strip forming substantially the entire conductive strip, and
  a contact region near an outer portion of the plurality of banks, the contact region configured to electrically connect an integrated circuit chip located near an interior region of the leadframe to an external circuit at the outer portion of the bank;

at least one adhesive fastener coupled to at least some of the conductive strips;

an integrated circuit chip fastened to the leadframe by the fastener and having a plurality of electric connection regions; and a plurality of wire connectors, each connector configured to connect one of the electric connection regions to a single one of the conductive strips.

10. The device of claim 9, wherein the integrated circuit chip has a planar shape, the adhesive fastener includes a planar material having a lower surface that extends along a plane defined by a surface of the conductive strips, and an upper surface coupled to a lower surface of the integrated circuit chip, and the surfaces of the integrated circuit chip and the adhesive fastener are substantially the same in size and shape.

11. The device of claim 9, wherein the integrated circuit chip has a planar shape, the adhesive fastener includes a planar material having a lower surface that extends along a plane defined by a surface of the conductive strips, and an upper surface coupled to a lower surface of the integrated circuit chip, and the surfaces of the adhesive fastener respectively have a surface area that is less than the surface area of the lower surface of the integrated circuit chip.

12. The device of claim 9, further including another integrated circuit chip and another adhesive fastener that is coupled to at least some of the conductive strips and fastens the other integrated circuit chip to the leadframe.

13. The device of claim 9, wherein each bank of conductive integrated circuit chip connectors is electrically isolated from other banks by the separation between the tips of the end portions of the respective conductive strips, and further including additional adhesive fasteners and integrated circuit chips, each adhesive fastener being connected to one of the conductive banks and to an integrated circuit chip.

14. The device of claim 9, wherein the at least one adhesive fastener includes adhesive fasteners on each of at least two of the banks, and the at least two of the banks of conductive integrated circuit chip connectors are coupled to the integrated circuit chip via the adhesive fasteners on each of the at least two of the banks.

15. The device of claim 9, wherein the at least one adhesive fastener connects the integrated circuit chip to an upper surface of the conductive strips, the plurality of electric connection regions of the integrated circuit chip are on an upper surface of the integrated circuit chip, and the wire connectors are wire bond connectors that extend from the upper surface of the integrated circuit chip to the a portion of the underlying conductive strips extending laterally from below the integrated circuit chip.

16. The device of claim 1, further including, for each of a plurality of the conductive strips, a wire bond connector extending from the conductive strip to an upper surface of the integrated circuit chip that is opposite a surface of the integrated circuit chip in contact with the fastening material.

17. A wire-bonded multi-chip integrated circuit and leadframe device comprising:

a planar leadframe including
 a plurality of banks of conductive strips, each bank having an inner region and an outer region, the outer region being wider than the inner region and extending to an outer periphery of the planar leadframe, the strips for each bank respectively having an inner end portion at the inner region of the bank, the inner end portions of said plurality of conductive strips being at a substantially parallel angle to one another and along outer portions thereof, arranged to fan out at an oblique angle, relative to the substantially parallel angle, and each of the inner end portions having a tip separated from tips of the other strips by an electrically insulative gap, the outer portions providing a contact at the outer region of the bank wherefrom an electrical connection to an integrated circuit chip is provided for an external circuit, and an intermediate region connecting the inner end portion to the outer end portion;

a plurality of integrated circuit chips over the leadframe and electrical connection regions on an upper surface thereof;

for each integrated circuit chip, adhesive fastener material that couples a lower surface of the integrated circuit chip to an upper surface of the conductive strips, the adhesive fastener material for each integrated circuit chip being separated from adhesive fastener material that couples another one of the integrated circuit chips; and a plurality of wire bond connectors, each connector connected to an electrical connection region on an upper surface of an integrated circuit chip and to one of the conductive strips extending laterally from below the integrated circuit chip.

18. The device of claim 17, wherein the integrated circuit chips have a planar shape, the adhesive fastener material for each chip includes a planar material having a lower surface that extends along a plane defined by a surface of the conductive strips, and an upper surface coupled to a lower surface of the integrated circuit chip, and the surfaces of the integrated circuit chips and the adhesive fastener material for each chip are substantially the same in size and shape.

19. The device of claim 17, wherein the integrated circuit chips have a planar shape, the adhesive fastener material for each chip includes a planar material having a lower surface that extends along a plane defined by a surface of the conductive strips, and an upper surface coupled to a lower surface of the integrated circuit chip, and the surfaces of the adhesive fastener material for each chip respectively have a surface area that is less than the surface area of the lower surface of the integrated circuit chip to which the adhesive fastener material is connected.

20. The device of claim 17, wherein the adhesive fastener material for at least one of the integrated circuit chips is connected to conductive strips in at least two of the banks, and different ones of the electrical connection regions of the at least one of the integrated circuit chips are connected to conductive strips in different ones of the at least two of the banks.

21. The device of claim 17, wherein the intermediate region of each strip within each bank extends at an oblique angle relative to the intermediate region of adjacent ones of the strips within the bank, with the end portions extending in a direction that is parallel to a direction that the end portions of other ones of the strips in the bank extend.

* * * * *